United States Patent
Kuibira et al.

(10) Patent No.: US 7,806,984 B2
(45) Date of Patent: *Oct. 5, 2010

(54) SEMICONDUCTOR OR LIQUID CRYSTAL PRODUCING DEVICE

(75) Inventors: Akira Kuibira, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1410 days.

This patent is subject to a terminal disclaimer.

(21) Appl. No.: 10/478,278

(22) PCT Filed: Feb. 26, 2003

(86) PCT No.: PCT/JP03/02138

§ 371 (c)(1), (2), (4) Date: Nov. 20, 2003

(87) PCT Pub. No.: WO03/072850

PCT Pub. Date: Sep. 4, 2003

(65) Prior Publication Data

US 2004/0144322 A1 Jul. 29, 2004

(30) Foreign Application Priority Data

Feb. 27, 2002 (JP) ............... 2002-050629

(51) Int. Cl.
*H01L 21/205* (2006.01)
*C23C 16/44* (2006.01)

(52) U.S. Cl. ................... 118/725; 156/345.52

(58) Field of Classification Search ........... 118/725, 118/728, 723 E, 723 R; 156/345.47, 345.52
See application file for complete search history.

(56) References Cited

U.S. PATENT DOCUMENTS 5,462,603 A 10/1995 Murakami (Continued)

FOREIGN PATENT DOCUMENTS

EP 0 628 644 12/1994

(Continued)

OTHER PUBLICATIONS

Merriam-Webster On-line. www.m-w.com. "Embedded".*

(Continued)

*Primary Examiner*—Sylvia R. MacArthur
(74) *Attorney, Agent, or Firm*—McDermott Will & Emery LLP

(57) ABSTRACT

An apparatus for manufacturing a semiconductor or liquid crystal has, within a reaction chamber 1 to which a reactive gas is supplied, a ceramic holder 2 having a resistive heating element 7 embedded therein; and further comprises a ceramic cylindrical support member 3 one end of which supports the ceramic holder 2 and the other end of which is fixed to a portion of the reaction chamber 1, and an inert gas supply tube 4 and inert gas evacuation tube 5 each having an opening inside the cylindrical support member 3. It is preferable that the inert gas within the cylindrical support member 3 be maintained at less than 0.1 MPa (one atmosphere). By means of such an arrangement, oxidation and corrosion of electrodes provided on the rear surface of the ceramic holder can be prevented, without an oxidation-resistant seal or corrosion-resistant seal being applied. The semiconductor or liquid crystal manufacturing apparatus also ensures the thermal uniformity in the ceramic holder and eliminates useless power consumption. Moreover, the apparatus size can be reduced, and manufacturing costs can be decreased.

9 Claims, 3 Drawing Sheets

U.S. PATENT DOCUMENTS

| | | | | |
|---|---|---|---|---|
| 5,478,429 | A | * | 12/1995 | Komino et al. ......... 156/345.44 |
| 5,542,559 | A | * | 8/1996 | Kawakami et al. ............ 216/67 |
| 5,660,740 | A | * | 8/1997 | Komino ....................... 216/67 |
| 5,688,331 | A | | 11/1997 | Aruga et al. |
| 5,753,891 | A | * | 5/1998 | Iwata et al. ................. 219/390 |
| 6,126,753 | A | * | 10/2000 | Shinriki et al. .............. 118/715 |
| 6,350,620 | B2 | * | 2/2002 | Chang et al. ................ 436/518 |
| 6,439,244 | B1 | * | 8/2002 | Wu ............................. 134/1.1 |
| 6,645,344 | B2 | * | 11/2003 | Caldwell et al. ....... 156/345.53 |
| 2004/0144322 | A1 | * | 7/2004 | Kuibira et al. ............. 118/728 |
| 2004/0149227 | A1 | * | 8/2004 | Saito et al. ................. 118/728 |
| 2004/0168641 | A1 | * | 9/2004 | Kuibira et al. ............. 118/728 |
| 2005/0178335 | A1 | * | 8/2005 | Strang et al. ............... 118/725 |

FOREIGN PATENT DOCUMENTS

| | | |
|---|---|---|
| EP | 0 628 644 A2 | 12/1994 |
| GB | 2 279 366 | 1/1995 |
| JP | 03-034540 | 2/1991 |
| JP | 3-34540 | 2/1991 |
| JP | 07 78766 | 3/1995 |
| JP | 07-153706 | 6/1995 |

OTHER PUBLICATIONS

Merriam-Webster Collegiate Dictionary. 1999, Merriam-Webster. Inc. 10th Ed."Embed", p. 376. (recited as 2 pages).*

"Ceramic" Taken from www.wikipedia.com on Aug. 27, 2008, page last modified Aug. 20, 2008 and retrieved Aug. 27, 2008.*

"embedded". Merriam-Webster's Collegiate Dictionary., 10$^{th}$ Edition. Merriam Webster. (1993) also found on www.m-w.com/dicitionary/embed.*

Human Translation of JP 03-034540 held to Yoshiyuki published Feb. 14, 1991.*

* cited by examiner

SEMICONDUCTOR OR LIQUID CRYSTAL PRODUCING DEVICE

TECHNICAL FIELD

This invention relates to an apparatus for manufacturing a semiconductor or liquid crystal, comprising means for holding and heating a material to be treated in a reaction chamber, and in particular relates to a CVD apparatus, a plasma CVD apparatus, an etching apparatus, a plasma etching apparatus, or other apparatus for manufacturing a semiconductor or liquid crystal.

BACKGROUND ART

When etching and film formation are performed on a semiconductor wafer, normally single semiconductor-wafer production equipment, with excellent reaction control, is used. The semiconductor wafer is placed on the surface of a holder which is positioned within a reaction chamber, and may be left as is, or may be fixed in place mechanically, or may be chucked in place by electrostatic force by applying a voltage to an electrode embedded in the holder, or otherwise fixed to the holder.

The temperature of the semiconductor wafer held in this way is rigorously controlled, in order to maintain uniformity of the film formation rate and etch rate during CVD (chemical vapor deposition), plasma CVD or similar, or during etching, plasma etching or similar. In order to perform such rigorous temperature control, the holder is heated by a resistive heating element incorporated in the holder, so that the semiconductor wafer is heated to a prescribed temperature by heat transmitted from the surface thereof.

The holder is supported by a cylindrical member at a portion other than the surface for holding a material to be treated, and installed within the reaction chamber. Lead wires are connected to electrodes provided in a portion of the holder other than the surface for holding the material to be treated, to supply power from outside to a resistive heating element, RF electrode, electrostatic chucking circuit, or similar embedded in the holder. The holder is formed from a material endowed with heat resistance, insulating properties, and corrosion resistance, such as for example a ceramic material such as aluminum nitride or silicon nitride. The cylindrical member is formed from the above ceramic material endowed with heat resistance and corrosion resistance, or from a metal such as W or Mo, or such a metal with a corrosion-resistant covering applied.

In conventional semiconductor manufacturing apparatus as described above, halogen gas and other highly corrosive gases are used as reactive gases in CVD, etching and other processes, and so the electrodes and lead wires of resistive heating elements and similar are housed within the cylindrical member mounted on the holder, and the two ends are hermetically sealed to the holder and the reaction chamber, so as to protect the lead wires from contact with corrosive gas.

However, although the interior of the cylindrical member is isolated from the corrosive gas, it is exposed to air, which is an oxidizing atmosphere, and so oxidation of electrodes is unavoidable. For example, when the holder is heated to 600° C. to induce CVD reaction of the treated material, the electrodes mounted on the rear surface of the holder are also exposed to an oxidizing atmosphere at approximately 600° C., so that it has been necessary to apply an oxidation-resistant seal to the electrodes for protection.

In addition to heating the treated material, a portion of the heat generated by the holder escapes via the cylindrical member and is wasted, being lost through thermal transfer to the air filling the interior space from the surface of the cylindrical member. Further, because the space between the cylindrical member and the reaction chamber is hermetically sealed with an O-ring, and forced cooling to 200° C. or below is performed in order to protect this O-ring, heat is lost at this cooled portion. Consequently the temperature of the holder is greatly reduced at the portion at which the cylindrical member is mounted, so that it is difficult to maintain thermal uniformity over the entire holding surface, and moreover the consumed power which is lost to waste is substantial.

Further, whereas the holder is heated to a high temperature such as from 300° C. to 800° C., the end portion of the cylindrical member supporting the holder is forcibly cooled to 200° C. or lower, as explained above, so that thermal stresses arise due to temperature differences in the length direction of the cylindrical member. If thermal gradients become too large, cracking may occur in the cylindrical member, which is formed from brittle ceramic material; hence it has been necessary to make the length of the cylindrical member, for example, approximately 300 mm.

In the case of ceramic cylindrical members, which must be fabricated by molding and sintering and cannot be fabricated by melting and hardening as with metal materials, manufacturing yields drop sharply as the length is increased, and moreover it is extremely difficult to perform the operations to apply an oxidation-resistant seal to electrodes within a long cylindrical member, so that production yields are lowered and costs are increased as a result. Further, because a holder with such a long cylindrical member mounted must be housed inside the reaction chamber, it is different to reduce the size of the reaction chamber.

The above problems with the prior art are not limited to a semiconductor manufacturing apparatus alone; similar problems arise in the case of a liquid crystal manufacturing apparatus in which a holder which holds a treated material and in which is embedded a resistive heating element must be held within an airtight reaction chamber.

DISCLOSURE OF THE INVENTION

This invention was made in light of these circumstances of the prior art. It is an object of the present invention to provide an apparatus for manufacturing a semiconductor or liquid crystal which enables the prevention of oxidation and corrosion of electrodes provided on the rear surface of a holder, even if an oxidation-resistant seal or corrosion-resistant seal is not applied, maintains thermal uniformity of the holder and suppresses wasted power consumption, and moreover enables reduction of the apparatus size and the lowering of manufacturing costs.

In order to achieve the above object, this invention provides an apparatus for manufacturing a semiconductor or liquid crystal, provided with a ceramic holder which holds on the surface and heats a material to be treated within a reaction chamber to which is supplied a reactive gas, in which the apparatus comprises a ceramic cylindrical support member, one end of which supports the ceramic holder at a surface other than the surface for holding a material to be treated, and the other end of which is fixed to one portion of the reaction chamber; a supply tube, which supplies an inert gas to the space inside the cylindrical support member; and an evacuation tube and evacuation pump, to evacuate the inert gas from the space inside the cylindrical support member. The interior of the reaction chamber to which reactive gas is supplied is maintained in a depressurized state at approximately 8 kPa.

In the above-described apparatus for manufacturing a semiconductor or liquid crystal of this invention, it is preferable that the inert gas atmosphere within the above-described cylindrical support member be at a pressure of less than 0.1 MPa (one atmosphere). It is still more preferable that the space between the other end of the above cylindrical support member and the portion of the reaction chamber not be hermetically sealed.

In the above-described semiconductor or liquid crystal manufacturing apparatus of this invention, it is preferable that the above inert gas supply tube have an opening near the ceramic holder, that the inert gas evacuation tube have an opening near the reaction chamber bottom, and that the inert gas atmosphere in the space within the cylindrical support member be such that pressure is gradually reduced from the ceramic holder side toward the reaction chamber bottom side.

In the above-described semiconductor or liquid crystal manufacturing apparatus of this invention, it is preferable that the above inert gas supply tube and the inert gas evacuation tube both have an opening near the reaction chamber bottom, and that the inert gas atmosphere in the inert gas evacuation tube be such that pressure is gradually reduced from the cylindrical support member side toward the evacuation pump.

In the above-described semiconductor or liquid crystal manufacturing apparatus of this invention, it is preferable that within the above cylindrical support member there be a partition plate between the ceramic holder and the reaction chamber bottom, that the inert gas supply tube have an opening in the space between the partition plate and the ceramic holder, that the inert gas evacuation tube have an opening between the partition plate and the reaction chamber bottom, and that the partition plate have an inert gas vent.

In the above-described semiconductor or liquid crystal manufacturing apparatus of this invention, it is preferable that the inert gas evacuation tube which evacuates an inert gas from the space within the above cylindrical support member and the reactive gas evacuation tube which evacuates a reactive gas from within the reaction chamber are merged midway, and share an evacuation pump. Further, the inert gas evacuation tube which evacuates an inert gas from the space within the above cylindrical support member and the reactive gas evacuation tube which evacuates a reactive gas from within the reaction chamber may in part have a dual construction.

BEST MODE FOR CARRYING OUT THE INVENTION

Figure 1:
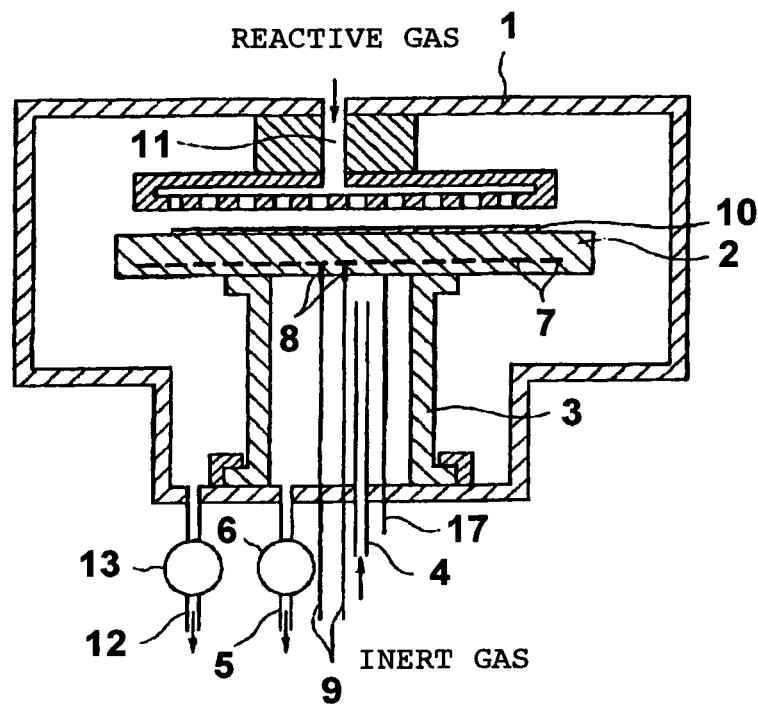
FIG. 1 is a schematic cross-sectional view showing one specific example of the semiconductor manufacturing apparatus of this invention.

In the apparatus for manufacturing a semiconductor or liquid crystal of this invention, for example as shown in FIG. 1, a ceramic holder 2 is supported within a reaction chamber 1 by a ceramic cylindrical support member 3, and in addition an inert gas supply tube 4 and an inert gas evacuation tube 5 are provided; while supplying an inert gas to the interior of the cylindrical support member 3, the inert gas is simultaneously evacuated by the evacuation pump 6. Electrodes 8 provided on the rear surface of the ceramic holder 2 in order to supply power to the resistive heating element 7 and lead wires 9 connected to the electrodes 8 are housed within the cylindrical support member 3, and are drawn outside from a portion of the reaction chamber 1. A silicon wafer 10, as a material to be treated, is held on the surface of the ceramic holder 2 as shown in FIG. 1, and the reactive gas is introduced into the reaction chamber 1 via the reactive gas supply tube 11 and evacuated from the reactive gas evacuation tube 12 by the evacuation pump 13.

Through the supply and evacuation of the inert gas in the above manner, an inert gas atmosphere can be maintained in the space within the cylindrical support member 3 closed off on both ends by the ceramic holder 2 and the reaction chamber 1, and the intrusion into the cylindrical support member 3 of the reactive gas in the reaction chamber containing halogen gas or other corrosive gas, as well as the intrusion into the cylindrical support member of air, which is an oxidizing environment, from outside the apparatus, can be prevented.

In this way, by maintaining as the atmosphere within the cylindrical support member 3 an inert gas which is not a reactive gas and not air, the electrodes 8 provided on the rear surface of the ceramic holder 2 are protected by the inert gas, and there is no concern of the occurrence of oxidation or corrosion even if they are exposed to high temperatures, and so no need to perform corrosion-resistant sealing or oxidation-resistant sealing.

As the inert gas, a gas which does not cause a reaction resulting in degradation of the electrode constituent material is satisfactory; a rare gas such as He, Ne, Ar, Kr, Xe, or Rn may be used, as well as $N_2$ gas or similar; from the standpoint of cost and other factors, $N_2$ and Ar are preferable.

Also, by maintaining the inert gas atmosphere within the cylindrical support member in a reduced-pressure state of less than 0.1 MPa (one atmosphere), the transmission of heat from the surface of the cylindrical support member via the surrounding atmosphere can be reduced. The space between the cylindrical support member and the reaction chamber can also be hermetically sealed using an O-ring or by other means, as in the prior art, but a hermetic seal is not necessary. If the space between the reaction chamber and the cylindrical support member is hermetically sealed, the escape of heat from the cylindrical support member to the reaction chamber is increased, and thermal uniformity in the ceramic holder is reduced, leading to energy wastage, so that it is preferable that a hermetic seal not be provided.

Hence by maintaining the inert gas atmosphere within the cylindrical support member in a reduced-pressure state of less than 0.1 MPa (one atmosphere), and by not sealing the space between the reaction chamber and the cylindrical support member using an O-ring or by other means, the escape of heat from the cylindrical support member to the surrounding atmosphere and to the reaction chamber can be suppressed, and in addition there is no longer a need for forced cooling to approximately 200° C. or lower to protect an O-ring; the thermal uniformity of the ceramic holder is improved, and wasted heat consumption is greatly reduced, for a substantial reduction in power consumption.

Because there is no need to use an O-ring for hermetic sealing of the space between the reaction chamber and the cylindrical support member, there is no need for forced cooling so that the temperature of the portion at which the reaction chamber and the cylindrical support member are in contact is 200° C. or lower. Consequently it is sufficient that the temperature of the portion at which the reaction chamber and cylindrical support member are in contact be below the heat resistance limit of the reaction chamber (in the case of Al, for example, less than the melting point of 660° C.). As a result, thermal stresses appearing in the length direction of the ceramic cylindrical support member can be relaxed, and the cylindrical support member can be made shorter than in the prior art, so that manufacturing costs can be lowered considerably and the size of apparatus, including the reaction chamber, can be decreased.

Next, a number of specific examples of the apparatus for manufacturing a semiconductor or liquid crystal of this invention are explained, based on the drawings. In the apparatus shown in FIG. 1, the inert gas supply tube 4 inserted into the cylindrical support member 3 has an opening near the ceramic holder 2, and the inert gas evacuation tube 5 have an opening near the bottom of the reaction chamber 1. Hence it is possible to create an inert gas pressure distribution with the inert gas atmosphere pressure less than 0.1 MPa (one atmosphere) within the cylindrical support member 3, and moreover with the pressure gradually being reduced from the side of the ceramic holder 2, in which exist the electrodes 8, toward the bottom of the reaction chamber 1.

By means of this pressure distribution of the inert gas, intrusion of corrosive gas and air into the cylindrical support member 3 is efficiently prevented, and the electrodes 8 are constantly surrounded by the inert gas atmosphere, so that there is no danger of corrosion or oxidation. Hence there is no longer a need to apply a corrosion-resistant seal or oxidation-resistant seal to the electrodes 8, so that production yields are improved and overall costs can be lowered substantially.

Figure 2:
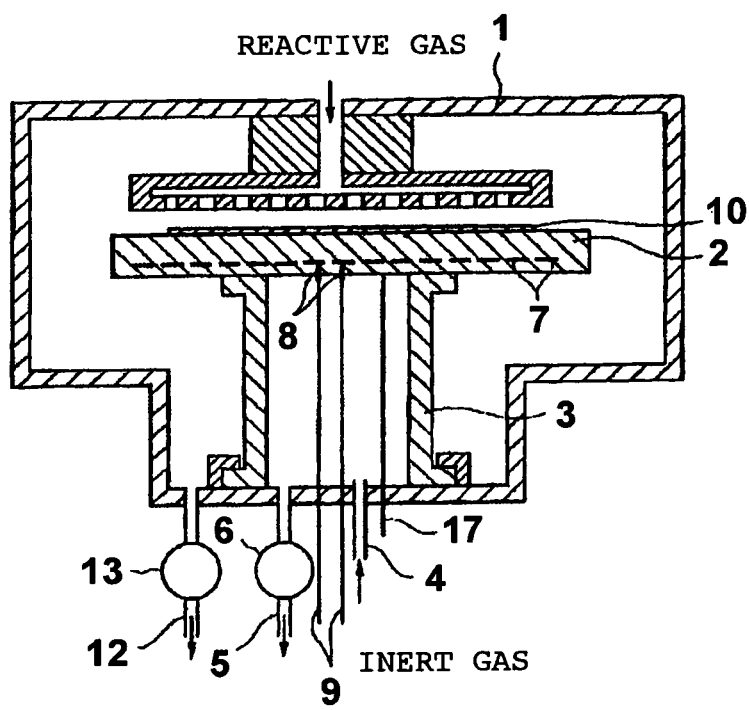
FIG. 2 is a schematic cross-sectional view showing another specific example of the semiconductor manufacturing apparatus of this invention.

In the apparatus shown in FIG. 2, the inert gas supply tube 4 and inert gas evacuation tube 5 both have openings near the bottom of the reaction chamber 1. Consequently it is possible to create an inert gas pressure distribution such that the inert gas atmosphere within the cylindrical support member 3 is less than 0.1 MPa (one atmosphere), and moreover the inert gas atmosphere within the inert gas evacuation tube 5 decreases gradually from the side of the cylindrical support member 3 toward the evacuation pump 6.

As a result the inert gas pressure within the cylindrical support member 3 near the bottom of the reaction chamber 1 is higher than the pressure of the reactive gas in the reaction chamber 1, and so intrusion of reactive gas from the bottom of the reaction chamber 1 and intrusion of air from the side of the evacuation pump 6 can be effectively prevented. Even if corrosive reactive gas were to diffuse in minute amounts from the reaction chamber 1 into the cylindrical support member 3, this gas would immediately be evacuated from the inert gas evacuation tube 5 via the evacuation pump 6, so that the electrodes 8 would constantly be surrounded by an inert gas atmosphere, with no danger of corrosion or oxidation. Hence in the apparatus of FIG. 2 also, an advantageous result similar to that of the above FIG. 1 can be expected.

Figure 3:
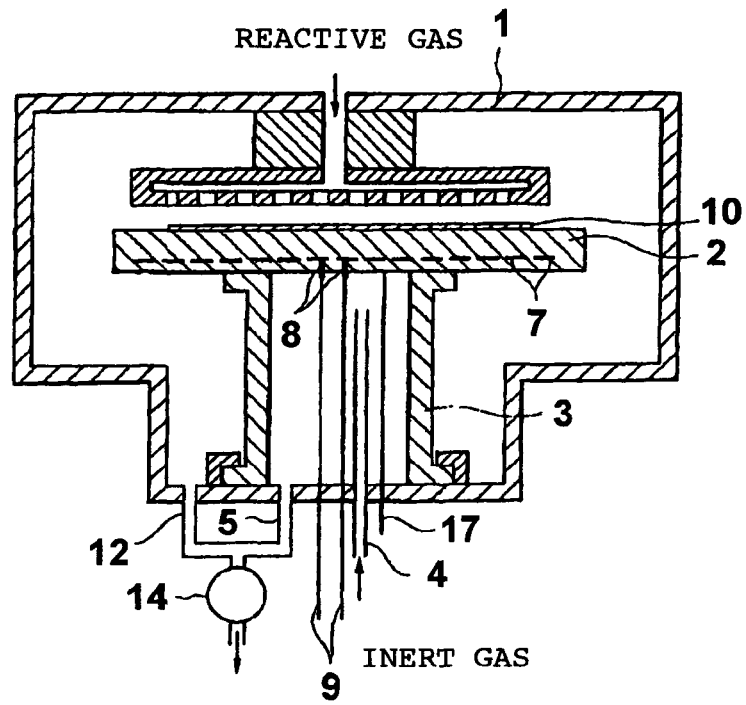
FIG. 3 is a schematic cross-sectional view showing one specific example of the semiconductor manufacturing apparatus of this invention, in which the evacuation pump is shared.

After the interior of the reaction chamber and the interior of the cylindrical support member are replaced with an inert gas, the supplied inert gas need only be evacuated, so the evacuation pump need not have a particularly large evacuation capacity. Hence as shown in FIG. 3, the inert gas evacuation tube 5 and the reactive gas evacuation tube 12 which evacuates the reactive gas supplied to the reaction chamber 1 can be merged midway, and evacuation pumps, which in the prior art are provided separately, can be shared, so that by employing only a single evacuation pump 14 the required installation space can be reduced.

Figure 4:
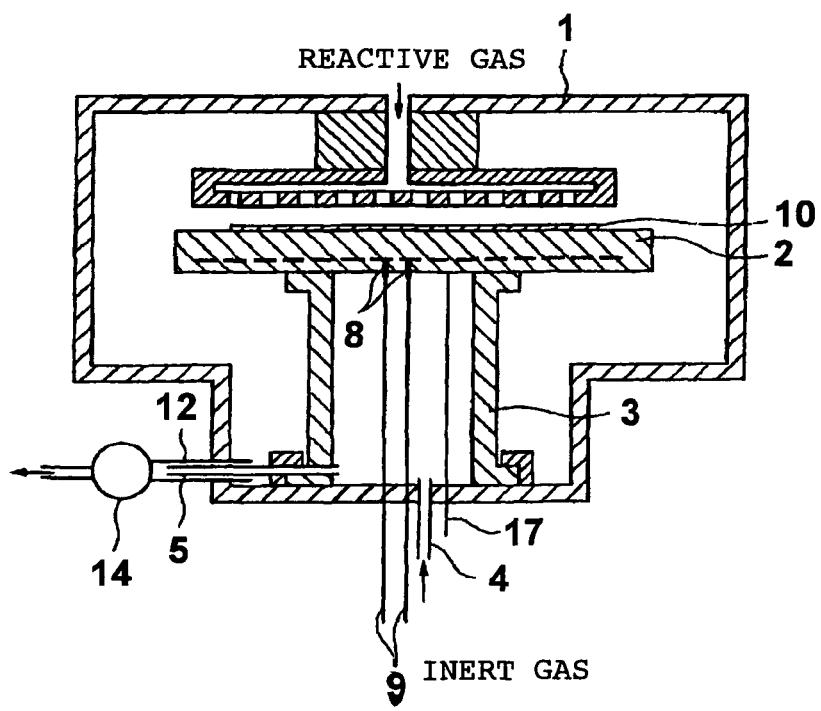
FIG. 4 is a schematic cross-sectional view showing one specific example of the semiconductor manufacturing apparatus of this invention, comprising a dual-structure evacuation tube.

When a single evacuation pump is shared by the inert gas evacuation tube and by the reactive gas evacuation tube, as shown in FIG. 4, portions of the inert gas evacuation tube 5 and reactive gas evacuation tube 12 can have a dual construction. By employing a dual tube construction, an aspirator effect occurs, and so it is possible to effectively prevent the intrusion into the cylindrical support member 3 of corrosive reactive gas in the reaction chamber 1.

Figure 5:
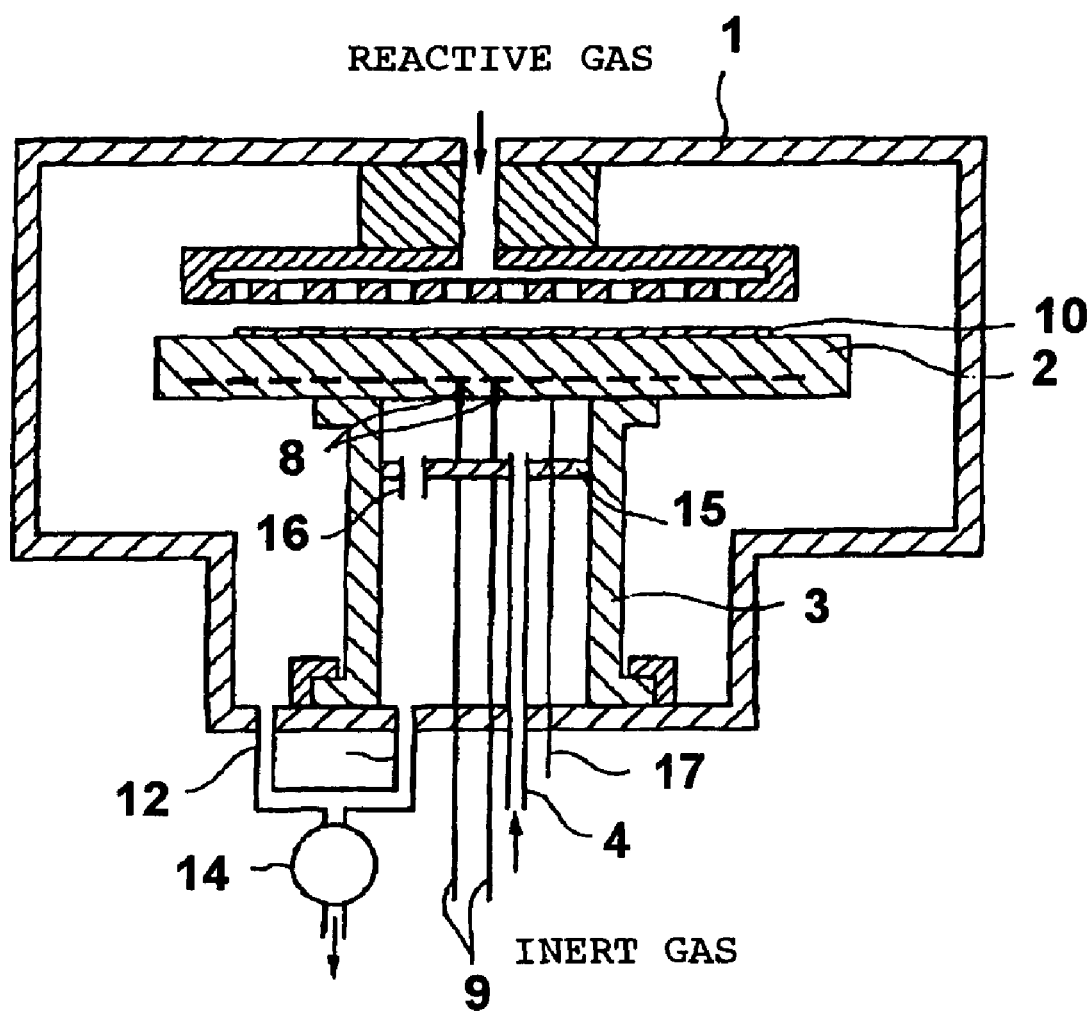
FIG. 5 is a schematic cross-sectional view showing another specific example of the semiconductor manufacturing apparatus of this invention.

As another specific example of the apparatus for manufacturing a semiconductor and liquid crystal of this invention, a partition plate 15 can be provided within the cylindrical support member 3 between the ceramic holder 2 and the bottom of the reaction chamber 1, as shown in FIG. 5, the inert gas supply tube 4 has an opening in the space between the partition plate 15 and the ceramic holder 2, and an inert gas vent 16 is provided penetrating the partition plate 15. In such an arrangement, the inert gas evacuation tube 5 can be opened between the partition plate 15 and the bottom of the reaction chamber 1.

In the apparatus shown in FIG. 5, inert gas can be supplied to the narrow space in the inside of the cylindrical support member 3 partitioned by the partition plate 15 and the ceramic holder 2, so that the electrodes 8 provided on the rear surface of the ceramic holder 2 are more completely protected by the inert gas, and intrusion of minute amounts of corrosive gas into the electrodes 8, with poor corrosion resistance and oxidation resistance, can be prevented, so that the lifetime of the electrodes 8 can be further prolonged. This invention has been explained referring to the attached drawings, but component combinations and arrangements can be modified as appropriate within the scope of this invention.

It is desirable that the ceramic holder and cylindrical support member of this invention be formed from a ceramic material selected from among aluminum nitride, silicon nitride, silicon carbide, and aluminum oxide. In the following examples and comparative examples, a silicon wafer is used as the material to be treated. Further, the interior of the reaction chamber to which reactive gas is supplied is maintained in a depressurized state at approximately 8 kPa.

Example 1

0.5 weight percent yttria ($Y_2O_3$) was added as a sintering agent to aluminum nitride (AlN) powder, and after further adding an organic binder, dispersing and mixing, spray-drying was used to perform granulation. The granulated powder was molded by uniaxial pressing to produce two compacts of shape A which provided dimensions of 350 mm in diameter and 10 mm in thickness after sintering. Also, the same granulated powder was used to form, by CIP (cold isostatic pressing), one compact of shape B which provided dimensions of 80 mm in outer diameter, 75 mm in inner diameter, and 100 mm in length after sintering.

After forming a groove of width 4.5 mm and depth 2.5 mm on the surfaces of the compacts with shape A, the compacts were degreased at 800° C. in a nitrogen flow. An Mo coil was laid into the grooves, and the two compacts were stacked and subjected to hot-press sintering in a nitrogen flow at 1900° C. for two hours, under a pressure of 9.8 MPa (100 kgf/cm$^2$). The surfaces of the sintered body thus obtained were polished using diamond abrasives, the Mo coil ends were exposed on the rear surface and electrodes were provided to obtain an AlN ceramic holder.

The compact with shape B was degreased in a nitrogen flow at 800° C., then sintered for six hours in a nitrogen flow at 1900° C. to obtain an AlN cylindrical support member. The above ceramic holder was set such that the electrodes were within the cylindrical support member, and the two were subjected to hot-press bonding at 1850° C. for two hours under a pressure of 9.8 MPa (100 kgf/cm$^2$). Then Mo lead wires were bonded to the electrodes on the rear surface of the ceramic holder using an Ag brazing.

As shown in FIG. 1, the ceramic holder 2, bonded to one end of the cylindrical support member 3, was placed within the reaction chamber 1 of the CVD apparatus, and the other end of the cylindrical support member 3 was fixed with a clamp to the bottom of the reaction chamber 1, but hermetic sealing using an O-ring or other means was not performed. An inert gas supply tube 4 was inserted into the cylindrical support member 3 until close to the ceramic holder 2, and an inert gas evacuation tube 5 provided midway with an evacuation pump 6 was inserted close to the bottom of the reaction chamber 1.

The interior of the cylindrical support member 3 was evacuated by the inert gas evacuation tube 5 while supplying N$_2$ gas from the inert gas supply tube 4, so that the interior of the cylindrical support member 3 was maintained at a pressure of less than 0.1 MPa (one atmosphere). While supplying TiCl$_4$+NH$_3$ as the reactive gas to the interior of the reaction chamber 1 from a reactive gas supply tube 11, the reaction chamber 1 was evacuated by the reactive gas evacuation tube 12 provided with an evacuation pump 13, and by supplying power from the lead wires 9 to heat the ceramic holder 2 to 600° C. (measured by the thermocouple 17) using a resistive heating element 7, TiN was vapor-deposited onto the wafer 10 placed on the treated material-holding surface.

Five units of the same CVD apparatus were fabricated as set forth above and subjected to TiN vapor deposition tests over extended lengths of time. As a result, no cracking of the cylindrical support member, corrosion of electrodes, or other problems occurred in any of the five units even after 1000 hours had elapsed. In conventional CVD apparatus, a cylindrical member of length 300 mm had been used in order to alleviate the thermal stresses due to cooling of the O-ring used for sealing; the length of the cylindrical support members in the CVD apparatus of this example was 100 mm, and so to this extent it was possible to reduce the size of the reaction chamber.

Comparative Example 1

The same method as in Example 1 above was used to fabricate an AlN ceramic holder and cylindrical support member, but the length of the cylindrical support member was made 300 mm, as in the prior art.

A CVD apparatus was constructed using this ceramic holder and cylindrical support member, and the height of the reaction chamber was increased by 250 mm in order to house the long cylindrical support member. An O-ring was used to hermetically seal the other end of the cylindrical support member to the reaction chamber bottom, and was maintained at 150° by water cooling. Further, the electrode portion was glass-sealed to provide oxidation resistance, and the atmosphere within the cylindrical support member was air at atmospheric pressure.

TiN vapor deposition tests at 600° C. were performed using the same method as in Example 1. When the power consumption in the above Example 1 was 100%, the power consumption in this Comparative Example 1 was 180%. Five units of the same apparatus were fabricated and subjected to TiN vapor deposition tests over long periods. In the tests, oxidation occurred starting at a portion of an electrode at which the glass seal was imperfect and made the supply of power impossible after 500 hours had elapsed in one unit, and after 1000 hours had elapsed in another unit.

Example 2

An AlN ceramic holder and cylindrical support member were produced by the same method as described in Example 1. The ceramic holder and cylindrical support member were used to fabricate the CVD apparatus shown in FIG. 2, that is, an apparatus which was the same as in Example 1 (FIG. 1) except that the inert gas supply tube 4 had an opening within the cylindrical support member 3 near the bottom of the reaction chamber 1. The other end of the cylindrical support member 3 was fixed with a clamp to the bottom of the reaction chamber 1, but hermetic sealing using an O-ring or other means was not performed.

The interior of the cylindrical support member 3 was evacuated while supplying N$_2$ gas, and the interior of the cylindrical support member 3 was maintained at a pressure of less than 0.1 MPa (one atmosphere). The interior of the reaction chamber 1 was evacuated while introducing TiCl$_4$+NH$_3$, and by heating the ceramic holder 2 to 600° C., TiN was vapor-deposited onto the wafer 10 placed on the treated material-holding surface.

As a result of this TiN vapor deposition test, when the power consumption in the above Example 1 were taken to be 100%, the power consumption in this example was 100%. Five units of the same apparatus were fabricated as set forth above, and upon conducting TiN vapor deposition tests over an extended period, no cracks in the cylindrical support members, corrosion of electrodes, or other problems occurred in any of the five units even after 1000 hours had elapsed.

Example 3

An AlN ceramic holder and cylindrical support member were produced by the same method as described in Example 1. The ceramic holder and cylindrical support member were used to fabricate the CVD apparatus shown in FIG. 3, that is, an apparatus which was the same as in Example 1 (FIG. 1) except that the inert gas evacuation tube 5 and reactive gas evacuation tube 12 were connected by a Y-shape joint to merge the gas flows, and a single evacuation pump 14 was connected downstream. The other end of the cylindrical support member 3 was fixed with a clamp to the bottom of the reaction chamber 1, and was hermetically sealed using a metal seal.

The interior of the cylindrical support member 3 was evacuated while supplying N$_2$ gas, and the interior of the cylindrical support member 3 was maintained at a pressure of less than 0.1 MPa (one atmosphere). The interior of the reaction chamber 1 was evacuated while introducing TiCl$_4$+NH$_3$, and by heating the ceramic holder 2 to 600° C., TiN was vapor-deposited onto the wafer 10 placed on the treated material-holding surface.

As a result of this TiN vapor deposition test, when the power consumption in the above Example 1 were taken to be 100%, the power consumption of this example was 120%. Five units of the same apparatus were fabricated, and upon conducting TiN vapor deposition tests over an extended period, no cracks in the cylindrical support members, corrosion of electrodes, or other problems occurred in any of the five units even after 1000 hours had elapsed.

Example 4

An AlN ceramic holder and cylindrical support member were produced by the same method as described in Example 1. The ceramic holder and cylindrical support member were used to fabricate the same CVD apparatus as that of the above Example 3 (FIG. 3). However, although the other end of the cylindrical support member 3 was fixed with a clamp to the bottom of the reaction chamber 1, a hermetic seal using an O-ring or metal seal was not applied.

The interior of the cylindrical support member 3 was evacuated while supplying $N_2$ gas, and the interior of the cylindrical support member 3 was maintained at a pressure of less than 0.1 MPa (one atmosphere). The interior of the reaction chamber 1 was evacuated while introducing $TiCl_4+NH_3$, and by heating the ceramic holder 2 to 600° C., TiN was vapor-deposited onto the wafer 10 placed on the treated material-holding surface.

As a result of this TiN vapor deposition test, when the power consumption in the above Example 1 was taken to be 100%, the power consumption of this example was 100%. Five units of the same apparatus were fabricated, and upon conducting TiN vapor deposition tests over an extended period, no cracks in the cylindrical support members, corrosion of electrodes, or other problems occurred in any of the five units even after 1000 hours had elapsed.

Example 5

An AlN ceramic holder and cylindrical support member were produced by the same method as described in Example 1. The ceramic holder and cylindrical support member were used to fabricate the CVD apparatus shown in FIG. 4, that is, an apparatus which was the same apparatus as in Example 2 (FIG. 2), except that the inert gas evacuation tube 5 and reactive gas evacuation tube 12 were drawn from a side wall of the reaction chamber 1 in a dual construction, and a single evacuation pump 14 was installed downstream therefrom. The other end of the cylindrical support member 3 was fixed with a clamp to the bottom of the reaction chamber 1, a hermetic seal using an O-ring or similar was not applied.

The interior of the cylindrical support member 3 was evacuated while supplying $N_2$ gas, and the interior of the cylindrical support member 3 was maintained at a pressure of less than 0.1 MPa (one atmosphere). The interior of the reaction chamber 1 was evacuated while introducing $TiCl_4+NH_3$, and by heating the ceramic holder 2 to 600° C., TiN was vapor-deposited onto the wafer 10 placed on the treated material-holding surface.

As a result of this TiN vapor deposition test, when the power consumption in the above Example 1 were taken to be 100%, the power consumption of this example was 100%. Five units of the same apparatus were fabricated as set forth above, and upon conducting TiN vapor deposition tests over an extended period, no cracks in the cylindrical support members, corrosion of electrodes, or other problems occurred in any of the five units even after 1000 hours had elapsed.

Example 6

An AlN ceramic holder and cylindrical support member were produced by the same method as described in Example 1. The ceramic holder and cylindrical support member were used to fabricate the CVD apparatus shown in FIG. 5. The other end of the cylindrical support member 3 was fixed with a clamp to the bottom of the reaction chamber 1, and a hermetic seal using an O-ring or similar was not applied.

More specifically, in the CVD apparatus of FIG. 5 a partition plate 15 was provided horizontally within the cylindrical support member 3, the inert gas supply tube 4 penetrates the partition plate 15 and had an opening near the ceramic holder 2, and moreover an inert gas vent 16 was provided in the partition plate 15, but otherwise the arrangement was the same as that of the apparatus of FIG. 3. The space between the partition plate 15 and the inner circumferential wall of the cylindrical support member 3, as well as the space between the partition plate 15 and the inert gas supply tube 4 and inert gas vent 16, were all hermetically sealed with glass having a softening point of 800° C.

The interior of the cylindrical support member 3 was evacuated while supplying $N_2$ gas, and the interior of the cylindrical support member 3 was maintained at a pressure of less than 0.1 MPa (one atmosphere). The interior of the reaction chamber 1 was evacuated while introducing $TiCl_4+NH_3$, and by heating the ceramic holder 2 to 600° C., TiN was vapor-deposited onto the wafer 10 placed on the treated material-holding surface.

As a result of this TiN vapor deposition test, when the power consumption in the above Example 1 were taken to be 100%, the power consumption in this example was 100%. Five units of the same apparatus were fabricated, and upon conducting TiN vapor deposition tests over an extended period, no cracks in the cylindrical support members, corrosion of electrodes, or other problems occurred in any of the five units even after 2000 hours had elapsed.

Example 7

Except for substituting a different ceramic material, a ceramic holder and cylindrical support member were produced by the same method as described in Example 1. That is, 3 weight percent yttria ($Y_2O_3$) and 2 weight percent alumina ($Al_2O_3$) were added as sintering agents to silicon nitride ($Si_3N_4$) powder, and after further adding an organic binder, dispersing and mixing, spray-drying was used to perform granulation. The granulated powder was used to fabricate an $Si_3N_4$ ceramic holder and cylindrical support member by the same method as in Example 1, except that sintering was performed in a nitrogen flow at 1750° C. for four hours.

Further, 2 weight percent boron carbide ($B_4C$) and 1 weight percent carbon (C) were added as sintering agents to silicon carbide (SiC) powder, and after further adding an organic binder, dispersing and mixing, spray-drying was used to perform granulation. The granulated powder was used to fabricate an SiC ceramic holder and cylindrical support member by the same method as in Example 1, except that sintering was performed in an argon flow at 2000° C. for seven hours.

Further, 2 weight percent magnesia (MgO) was added as a sintering agent to alumina ($Al_2O_3$) powder, and after further adding an organic binder, dispersing and mixing, spray-drying was used to perform granulation. The granulated powder was used to fabricate an $Al_2O_3$ ceramic holder and cylindrical support member by the same method as in Example 1, except that sintering was performed in a nitrogen flow at 1500° C. for three hours.

The above-described $Si_3N_4$, SiC, and $Al_2O_3$ ceramic holders and cylindrical support members were each used to fabricate a CVD apparatus unit similar to that of the above-described Example 1 (FIG. 1). In each of thus fabricated apparatus units, the other end of the cylindrical support member 3 was fixed with a clamp to the bottom of the reaction chamber 1, but a hermetic seal using an O-ring or similar was not applied.

In each CVD apparatus unit, the interior of the cylindrical support member 3 was evacuated while supplying $N_2$ gas, and the interior of the cylindrical support member 3 was maintained at a pressure of less than 0.1 MPa (one atmosphere). The interior of the reaction chamber 1 was evacuated while introducing $TiCl_4+NH_3$, and by heating the ceramic holder 2 to 600° C., TiN was vapor-deposited onto the wafer 10 placed on the treated material-holding surface.

As a result of this TiN vapor deposition test, when the power consumption in the above Example 1 was taken to be 100%, the power consumption in each of the apparatus units was 100%. Five units of each type of apparatus were fabricated, and upon conducting TiN vapor deposition tests over an extended period, no cracks in the cylindrical support members, corrosion of electrodes, or other problems occurred in any of the five units of each type even after 1000 hours had elapsed.

INDUSTRIAL APPLICABILITY

According to this invention, a semiconductor or liquid crystal manufacturing apparatus can be provided in which oxidation and corrosion of the electrodes provided on the rear surface of a ceramic holder can be prevented even without providing an oxidation-resistant seal or corrosion-resistant seal, in which thermal uniformity of the ceramic holder is maintained and wasted power consumption is eliminated; and moreover, the apparatus can be made more compact, and manufacturing costs can be decreased.

The invention claimed is:

1. An apparatus for manufacturing a semiconductor or liquid crystal, having a ceramic holder which is provided inside a reaction chamber to which is supplied a reactive gas, and which holds and heats a material to be treated on a surface thereof, said apparatus comprising: a cylindrical support member one end of which supports the ceramic holder at a portion other than the surface which holds the material to be treated and the other end of which is fixed to a portion of the reaction chamber; a supply tube which opens in the space within the cylindrical support member and supplies an inert gas to the space within the cylindrical support member; an evacuation tube which opens in the space within the cylindrical support member, and an evacuation pump which evacuates the inert gas through the evacuation tube from the space within the cylindrical support member; and a resistive heating element which is embedded in the ceramic holder, said resistive heating element being isolated from an atmosphere within the cylindrical support member.

2. The apparatus for manufacturing a semiconductor or liquid crystal according to claim 1, wherein an atmosphere of the inert gas in the space within said cylindrical support member is at a pressure of less than 0.1 MPa (one atmosphere).

3. The apparatus for manufacturing a semiconductor or liquid crystal according to claim 1 or claim 2, wherein the space between the other end of said cylindrical support member and the portion of the reaction chamber is not hermetically sealed.

4. The apparatus for manufacturing a semiconductor or liquid crystal according to claim 1 or claim 2, wherein said inert supply tube has an opening near the ceramic holder, and the inert gas evacuation tube has an opening near the bottom of the reaction chamber, and wherein a pressure of the inert gas in the space on the inside of the cylindrical support member gradually decreases from the side of the ceramic holder toward the bottom of the reaction chamber.

5. The apparatus for manufacturing a semiconductor or liquid crystal according to claim 1 or claim 2, wherein said inert gas supply tube and inert gas evacuation tube both have an opening close to the bottom of the reaction chamber, and within the inert gas evacuation tube, a pressure of the inert gas decreases from the cylindrical support member toward the evacuation pump.

6. The apparatus for manufacturing a semiconductor or liquid crystal according to claim 1 or claim 2, wherein a partition plate is provided within said cylindrical support member between the ceramic holder and the bottom of the reaction chamber, the inert gas supply tube has an opening between the partition plate and the ceramic holder, the inert gas evacuation tube has an opening between the partition plate and the bottom of the reaction chamber, and the partition plate has an inert gas vent.

7. The apparatus for manufacturing a semiconductor or liquid crystal according to claim 1 or claim 2, wherein the inert gas evacuation tube which evacuates the inert gas from the space inside said cylindrical support member and a reactive gas evacuation tube which evacuates a reactive gas from within the reaction chamber are merged partway, and share an evacuation pump.

8. The apparatus for manufacturing a semiconductor or liquid crystal according to claim 7, wherein the inert gas evacuation tube which evacuates the inert gas from the space inside said cylindrical support member and the reactive gas evacuation tube which evacuates the reactive gas from within the reaction chamber have in part a dual construction.

9. The apparatus for manufacturing a semiconductor or liquid crystal according to claim 1 or claim 2, wherein said ceramic holder and cylindrical support member are formed from a ceramic material selected from the group consisting of aluminum nitride, silicon nitride, silicon carbide, and aluminum oxide.

* * * * *